United States Patent
Dougherty

(10) Patent No.: US 9,488,689 B2
(45) Date of Patent: Nov. 8, 2016

(54) SYSTEMS AND METHODS FOR IDENTIFYING FAULT LOCATION USING DISTRIBUTED COMMUNICATION

(71) Applicant: General Electric Company, Schenectady, NY (US)

(72) Inventor: John James Dougherty, Newtown, PA (US)

(73) Assignee: General Electric Company, Schenectady, NY (US)

(*) Notice: Subject to any disclaimer, the term of this patent is extended or adjusted under 35 U.S.C. 154(b) by 155 days.

(21) Appl. No.: 14/471,201

(22) Filed: Aug. 28, 2014

(65) Prior Publication Data
US 2016/0061879 A1    Mar. 3, 2016

(51) Int. Cl.
| | |
|---|---|
| *G01R 31/08* | (2006.01) |
| *H02H 3/08* | (2006.01) |
| *H02H 1/00* | (2006.01) |
| *H02H 3/16* | (2006.01) |
| *H02H 7/26* | (2006.01) |
| *H02H 7/28* | (2006.01) |
| *G01R 31/02* | (2006.01) |
| *H02H 9/08* | (2006.01) |

(52) U.S. Cl.
CPC ......... *G01R 31/086* (2013.01); *G01R 31/025* (2013.01); *H02H 1/0061* (2013.01); *H02H 1/0092* (2013.01); *H02H 3/08* (2013.01); *H02H 3/167* (2013.01); *H02H 7/261* (2013.01); *H02H 7/28* (2013.01); *H02H 9/08* (2013.01)

(58) Field of Classification Search
CPC .............................. G01R 31/086; H02H 3/08
USPC ....................................................... 361/93.2
See application file for complete search history.

(56) References Cited

U.S. PATENT DOCUMENTS

| | | |
|---|---|---|
| 4,151,460 A | 4/1979 | Seese et al. |
| 4,800,509 A | 1/1989 | Nimmersjo |

(Continued)

FOREIGN PATENT DOCUMENTS

WO       9312566 A1     4/1993

OTHER PUBLICATIONS

Baldwin et al., "Fault locating in ungrounded and high-resistance grounded systems", IEEE Transactions, Aug. 7, 2002, pp. 1152-1159, vol. 37, Issue: 4,Tallahassee, FL USA.

(Continued)

*Primary Examiner* — Scott Bauer
(74) *Attorney, Agent, or Firm* — General Electric Company

(57) ABSTRACT

A fault location system for locating a fault in a power distribution system is provided. The fault location system includes a grounding resistor assembly configured to generate, in response to detection of the fault, a tracing signal that alternates between on periods and off periods, and a plurality of power distribution networks, wherein a first power distribution network of the plurality of power distribution networks is configured to receive a synchronizing message that includes a timing for the on periods and the off periods, measure, based on the synchronization message, a current through the first power distribution network to attempt to detect the fault, broadcast a fault detection message to all other power distribution networks of the plurality of power distribution networks when the fault is detected at the first power distribution network, and determine whether the first power distribution network is the location of the fault.

20 Claims, 3 Drawing Sheets

(56) References Cited

U.S. PATENT DOCUMENTS

| | | | |
|---|---|---|---|
| 4,837,519 A * | 6/1989 | Lopetrone | G01R 27/18 324/528 |
| 5,185,705 A | 2/1993 | Farrington | |
| 5,495,384 A | 2/1996 | Wallis et al. | |
| 7,180,300 B2 | 2/2007 | Premerlani et al. | |
| 7,751,165 B2 | 7/2010 | Sirivella et al. | |
| 8,213,138 B2 | 7/2012 | Dougherty | |
| 8,300,369 B2 | 10/2012 | Hamer | |
| 2006/0125486 A1 * | 6/2006 | Premerlani | G01R 31/086 324/512 |
| 2008/0097694 A1 | 4/2008 | Petras | |
| 2015/0346266 A1 * | 12/2015 | Dimino | G01R 31/025 702/59 |

OTHER PUBLICATIONS

European Search Report and Opinion issued in connection with corresponding EP Application No. 15182756.5 on Jan. 27, 2016.

* cited by examiner

SYSTEMS AND METHODS FOR IDENTIFYING FAULT LOCATION USING DISTRIBUTED COMMUNICATION

BACKGROUND

The field of the invention relates generally to power distribution systems, and more particularly, to determining a location of a fault in a power distribution system.

A ground fault is an undesirable condition in an electrical system, in which electrical current flows to the ground. A ground fault happens when the electrical current in a distribution or transmission network leaks outside of its intended flow path. Distribution and transmission networks are generally protected against faults in such a way that a faulty component or transmission line is automatically disconnected with the aid of an associated circuit breaker.

One grounding strategy for low voltage power systems is high resistance grounding. In high resistance grounded power systems, an impedance is provided between the neutral and ground of a source power transformer. This high resistance grounding allows continued operation of the power system even in case of single phase-to-ground fault. However, depending upon the system design, to permit such continued operation, the ground fault should be detected and located to relieve the extra voltage stress in the power system and also to remove the initial fault to eliminate the occurrence of series of faults from phase to phase.

In at least some known systems, identification of the location of high resistance ground faults requires either a manual search using portable measurement equipment for faulted lines or a relatively sophisticated central control module. Using portable measurement equipment may be relatively time consuming and labor-intensive. Further, using a central control module may be computationally complex and relatively expensive.

BRIEF DESCRIPTION

In one aspect, a fault location system for locating a fault in a power distribution system is provided. The fault location system includes a grounding resistor assembly configured to generate, in response to detection of the fault, a tracing signal that alternates between on periods and off periods, and a plurality of power distribution networks, wherein a first power distribution network of the plurality of power distribution networks is configured to receive a synchronizing message that includes a timing for the on periods and the off periods, measure, based on the synchronization message, a current through the first power distribution network to attempt to detect the fault, broadcast a fault detection message to all other power distribution networks of the plurality of power distribution networks when the fault is detected at the first power distribution network, and determine whether the first power distribution network is the location of the fault.

In another aspect, a power distribution network for locating a fault in a power distribution system is provided. The power distribution network includes a communication module configured to receive a synchronization message that includes a timing for on periods and off periods of a tracing signal, a current sensor configured to measure a current through the power distribution network, and a processor communicatively coupled to the current sensor and configured to detect a fault based on the measured current and the synchronization message, wherein the communication module communicatively is configured to broadcast a fault detection message when the fault is detected, and wherein the processor is further configured to determine whether the power distribution network is the location of the fault.

In yet another aspect, a method for determining a location of a fault in a power distribution system is provided. The method includes detecting the fault at a first power distribution network of a plurality of power distribution networks, generating a tracing signal using a grounding resistor assembly, wherein the tracing signal alternates between on periods and off periods, transmitting a synchronization message from the first power distribution network to all other power distribution networks of the plurality of power distribution networks, wherein the synchronization message includes a timing for the on periods and the off periods, measuring, at each power distribution network, based on the synchronization message, a current to attempt to detect the fault, broadcasting, from at least one power distribution network that detects the fault, a fault detection message, and determining whether the at least one power distribution network is the location of the fault.

DETAILED DESCRIPTION

Exemplary embodiments of a fault location system are provided. A grounding resistor assembly generates, in response to detection of the fault, a tracing signal that alternates between on periods and off periods. A plurality of power distribution networks utilize distributed communications to identify the fault location. For example, any power distribution networks that detect the fault may broadcast a fault detection message to all other power distribution networks.

Figure 1:
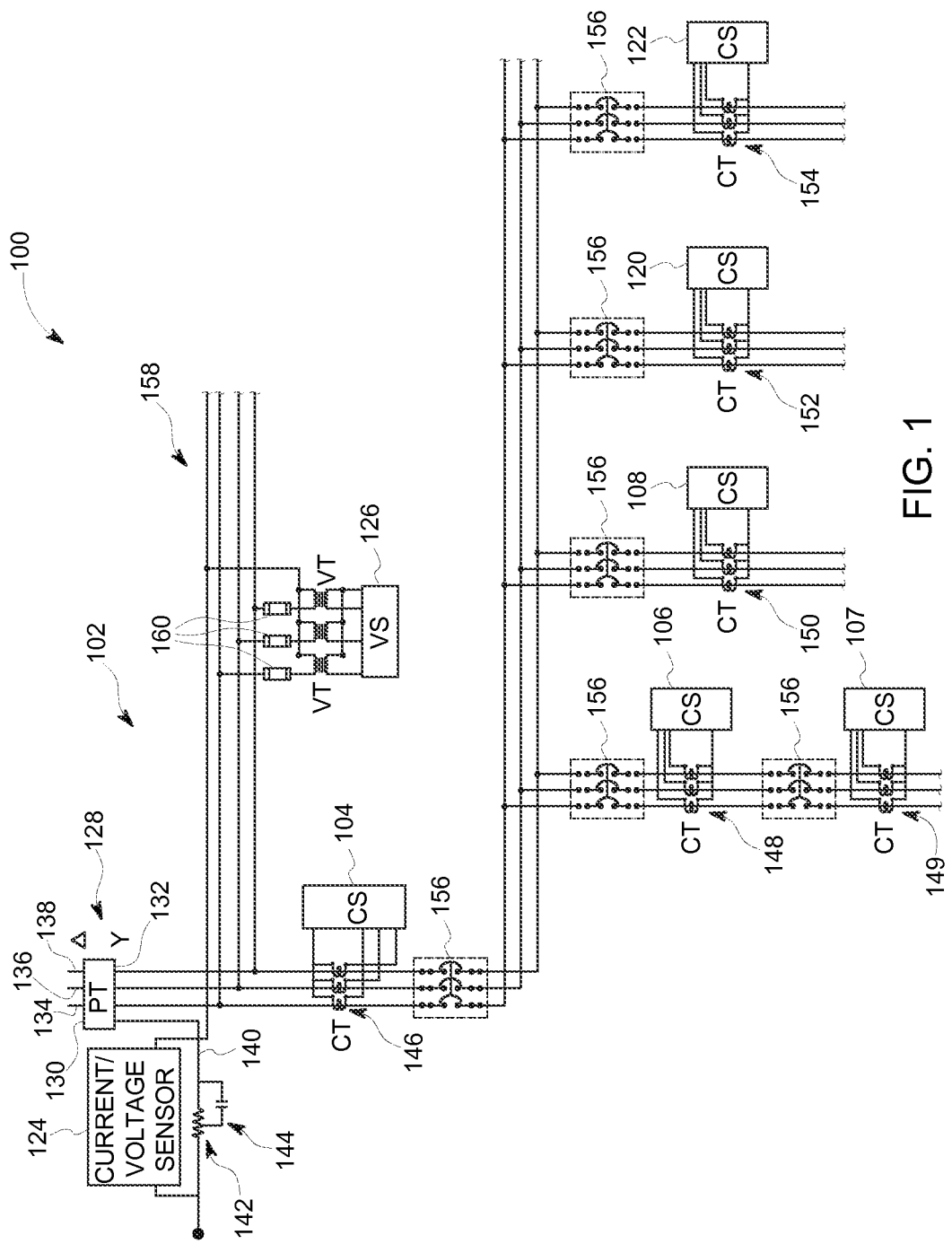
FIG. 1 is a circuit diagram of an exemplary ground fault locating system.

FIG. 1 is a circuit diagram of an exemplary ground fault locating system 100 for a three phase high resistance grounded power distribution system 102. Ground fault location system 100 includes a plurality of current sensors 104, 106, 107, 108, 120, 122, and 124 and at least one voltage sensor 126 coupled to three phase power distribution system 102, for measuring values of instantaneous currents and instantaneous voltages, respectively. In the exemplary embodiment, current sensors 104, 106, 107, 108, 120, 122, and 124 are current transformers configured to generate feedback signals representative of instantaneous current through each phase, and voltage sensor 126 is a voltage transformer adapted to measure an instantaneous voltage from phase to neutral. Alternatively, current sensors 104, 106, 107, 108, 120, 122, and 124 and voltage sensor 126 may each be any type of sensor that enables ground fault location system 100 to function as described herein.

In the exemplary embodiment, three phase power distribution system 102 includes a power transformer 128 having an input side 130 and an output side 132. Power transformer 128 includes three phases (i.e., a first phase 134, a second phase 136, and a third phase 138) coupled, in this embodiment, in a delta configuration at input side 130 and a wye configuration at output side 132. A ground line 140 at output side 132 of power transformer 128 is grounded using a grounding resistor 142. Grounding resistor 142 is configured to reduce a ground fault current, so that three phase power distribution system 102 can maintain operation while a fault is being located. In the embodiment shown in FIG. 1, sensor 124 is configured to measure a current flowing through grounding resistor 142. Alternatively, in some embodiments, sensor 124 is a voltage sensor configured to measure the neutral to ground voltage across grounding resistor 142.

A test signal generating device 144 is coupled across part of grounding resistor 142 and configured to introduce a test signal, or tracing signal, into three phase power distribution system 102. In one example, the test signal is a pulse signal generated at desired intervals. In another example, the test signal is a tone signal at a frequency other than a frequency of current distributed by three phase power distribution system 102. In the embodiment shown in FIG. 1, test signal generating device 144 is a switch provided to generate a pulse signal in three phase power distribution system 102. Grounding resistor 142 is periodically partially shorted by closing the switch to generate the pulse signal at desired intervals. In alternative embodiments, test signal generating device 144 may be a current source configured to inject a zero sequence current at a frequency other than the fundamental frequency of current into three phase power distribution system 102.

As illustrated, the three phases 134, 136, 138 of power transformer 128 are coupled to a plurality of three phase distribution networks 146, 148, 149, 150, 152, and 154. In the illustrated embodiment, current sensors 104, 106, 107, 108, 120, and 122 are coupled to the distribution networks 146, 148, 149, 150, 152, and 154 respectively. Alternatively, any number of current sensors may be utilized to accurately locate a ground fault in system 102, as described herein. Further, each distribution network is provided with a circuit breaker 156, as well as other protective devices, where appropriate. Also illustrated is another distribution network 158 coupled to power transformer 128. Voltage sensor 126 is coupled to distribution network 158 via a set of fuses 160 that limit current to voltage sensor 126. Voltage sensor 126 is configured to measure the phase to neutral voltage in system 102.

Analog signals from current sensors 104, 106, 107, 108, 120, 122, and 124 and voltage sensor 126 may be converted into digital signals. As discussed below, the monitored current values may be processed through phasor analysis to remove capacitive currents that are out of phase with the current through neutral grounding resistor 142 of power transformer 128. When present, a ground fault is located between a location at which a test signal, or tracing signal, is detected and a downstream location at which the test signal is not detected in system 102. System 102 facilitates locating and isolating a ground fault, as described herein.

Figure 2:
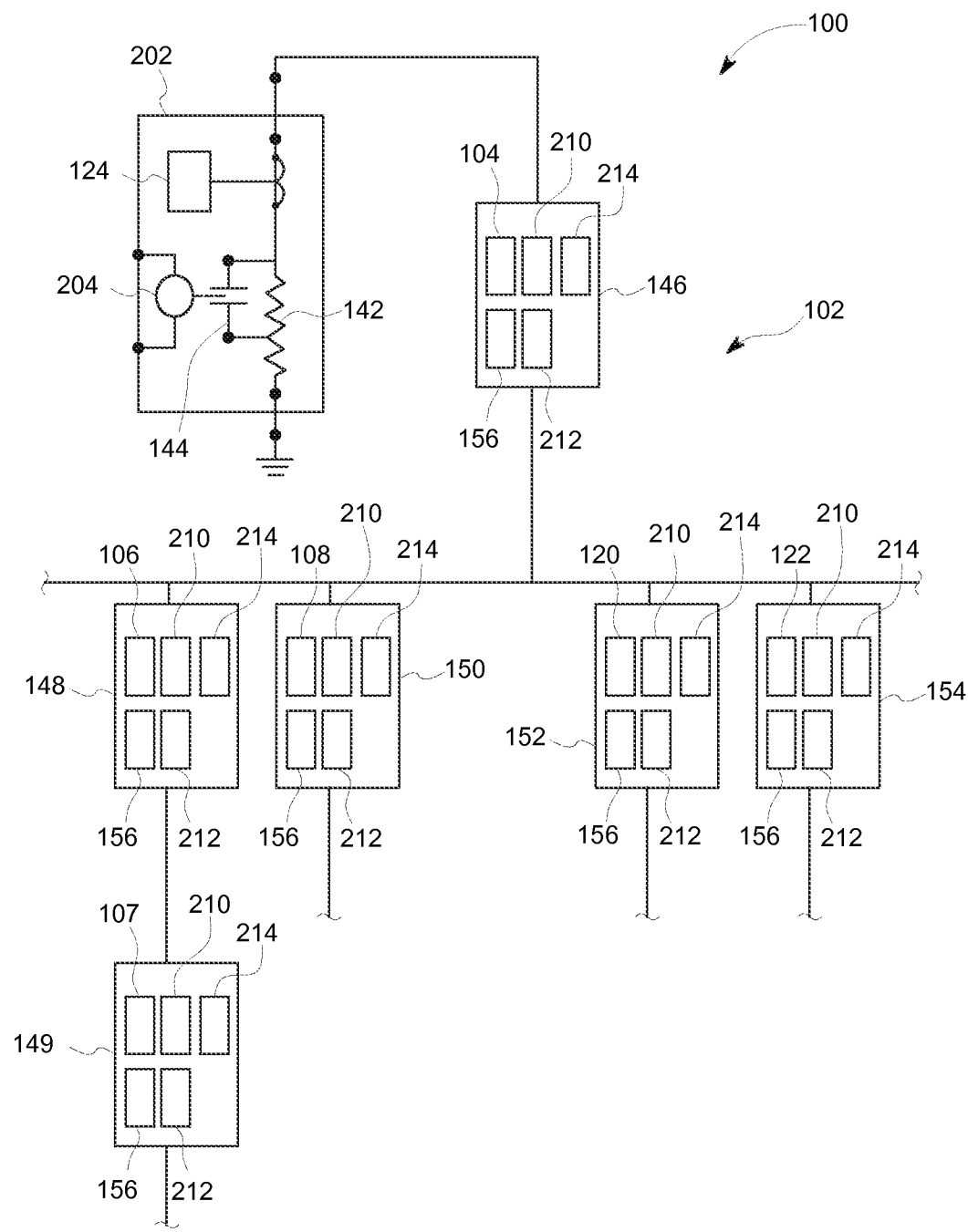
FIG. 2 is a simplified diagram of the ground fault locating system shown in FIG. 1.

FIG. 2 is a simplified diagram of ground fault locating system 100. As shown in FIG. 2, a grounding resistor assembly 202 includes grounding resistor 142, test signal generating device 144, and current sensor 124. Assembly 202 also includes a control module 204 coupled to test signal generating device 144. Control module 204 controls test signal generating device 144 to generate pulse signals at desired intervals, as described herein.

As used herein, each distribution network 146, 148, 149, 150, 152, and 154 is a collection of components communicatively coupled to one another to facilitate controlling power distribution through three phase power distribution system 102. In the exemplary embodiment, distribution networks 146, 148, 149, 150, 152, and 154 include current sensors 104, 106, 107, 108, 120, and 122, respectively, and circuit breakers 156. Further, in the exemplary embodiment, each distribution network 146, 148, 149, 150, 152, and 154 includes a processor 210, a memory device 212, and a communication module 214. Processor 210, memory device 212, and communication module 214 facilitate processing data and providing communication between distribution networks 146, 148, 149, 150, 152, and 154 to identify a fault location, as described herein. Power distribution network 146 may be referred to as a main power distribution network, and power distribution networks 148, 149, 150, 152, and 154 may be referred to as feeder power distribution networks.

Processor 210 may be programmed by encoding an operation as one or more executable instructions and by providing the executable instructions in memory device 212. Processor 210 may include one or more processing units (e.g., in a multi-core configuration). Further, processor 210 may be implemented using one or more heterogeneous processor systems in which a main processor is present with secondary processors on a single chip. As another illustrative example, processor 210 may be a symmetric multi-processor system containing multiple processors of the same type. Further, processor 210 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein.

In the exemplary embodiment, memory device 212 is one or more devices that enable information such as executable instructions and/or other data to be stored and retrieved. Memory device 212 may include one or more computer readable media, such as, without limitation, dynamic random access memory (DRAM), static random access memory (SRAM), a solid state disk, and/or a hard disk. Memory device 212 may be configured to store, without limitation, application source code, application object code, source code portions of interest, object code portions of interest, configuration data, execution events and/or any other type of data.

Communications modules 214 facilitate transmitting and receiving data between distribution networks 146, 148, 149, 150, 152, and 154. Communications modules 214 may transmit and receive data using any suitable communications medium, including, but not limited to, a wired (e.g., Ethernet) and/or wireless network, an Iridium satellite network, radio, 3G, Controller Pilot Data Link (CPDL), and Tactical Digital Information Links (TADIL). In some embodiments, communications modules 214 transmit and receive data using protocols in accordance with IEC 61850.

Figure 3:
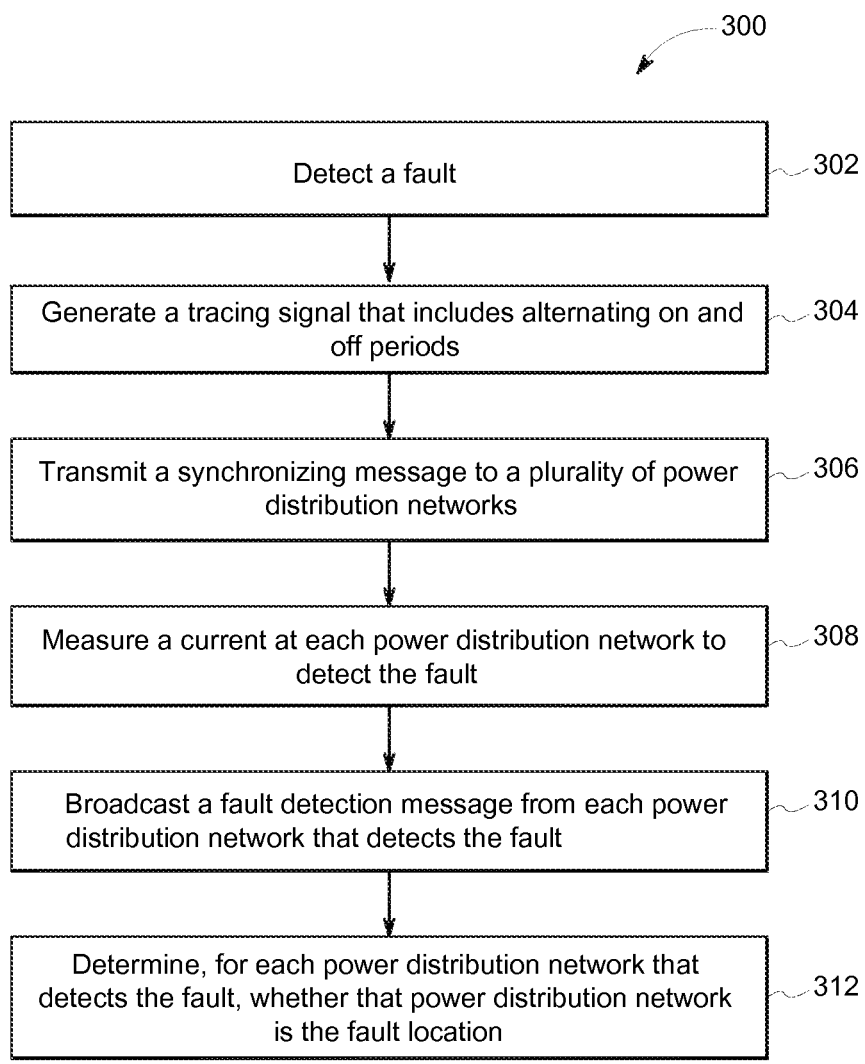
FIG. 3 is a flowchart of an exemplary method for locating a fault in the power distribution system shown in FIGS. 1 and 2.

FIG. 3 is a flowchart that illustrates an exemplary method 300 for locating a fault in power distribution system 102 (shown in FIGS. 1 and 2). Initially, main power distribution network 146 detects 302 (e.g., using current sensor 104) a ground fault in power distribution system 102. The fault may be, for example, one of first phase 134, second phase 136, and third phase 138 shorting over to ground line 140.

Upon detection 302 of the fault, control module 204 generates 304 a tracing signal that can be utilized to determine the location of the fault, as described herein. In the exemplary embodiment, to generate 304 the tracing signal, control module 204 controls test signal generating device 144 to selectively partially short grounding resistor 142, generating pulse signals. For example, grounding resistor 142 may be shorted for one second once every ten seconds. That is, test signal generating device 144 alternates between being on for one second (referred to herein as an "on period") and off for nine seconds (referred to herein as an "off period"). Alternatively, the tracing signal may be generated 304 using any technique that enables method 300 to determine a fault location as described herein. For example, in some embodiments, a zero sequence current at a frequency other than a fundamental frequency of current distributed by power distribution system 102 is injected across grounding resistor 142 to generate 304 the tracing signal.

In the exemplary embodiment, main power distribution network 146 is communicatively coupled to grounding resistor assembly 202. Accordingly, main power distribution network 146 transmits 306 a synchronizing message to the remaining power distribution networks 148, 149, 150, 152, and 154. Specifically, the synchronizing message includes the timing for the on and off periods of the tracing signal, ensuring that current sensors 104, 106, 107, 108, 120, and 122 in power distribution networks 146, 148, 149, 150, 152, or 154 are all measuring respective currents in lockstep relative to the on and off periods. In the exemplary embodiment, the synchronizing message also includes a compensation phasor calculated in main power distribution network 146.

Specifically, as main power distribution network 146 has a direct measurement of the current through grounding resistor 142, main power distribution network 146 can calculate a phasor from direct measurement. This phasor is converted to a unit amplitude, backward rotating compensation phasor by dividing a complex conjugate of the measured phase by its amplitude. Power distribution network 148, 149, 150, 152, and 154 each calculate a zero sequence current as measured by their respective current sensors 106, 107, 108, 120, and 122. The resultant zero sequence phasor is multiplied by the compensation phasor from main power distribution network 146.

Based on the synchronizing message, each power distribution network 146, 148, 149, 150, 152, and 154 measures 308 current using associated current sensors 104, 106, 107, 108, 120, and 122 to detect the fault. In the exemplary embodiment, to detect the fault, processor 210 performs long term averaging over multiple on periods and off periods of the tracing signal and compares the averaged value with an averaged value for main power distribution network 146. By performing long term averaging over multiple cycles of the tracing signal, relatively small differences in current can be detected. Alternatively, each power distribution network 146, 148, 149, 150, 152, and 154 may measure 308 current to detect the fault using any technique that enables power distribution system 102 to function as described herein. Each power distribution network 146, 148, 149, 150, 152, and 154 that detects the fault broadcasts 310 a fault detection message to all other power distribution networks.

Based on the one or more fault detection messages, each power distribution network 146, 148, 149, 150, 152, and 154 that detects the fault determines 312 whether that particular power distribution network is the fault location. Specifically, based on the one or more fault detection messages, each power distribution network 146, 148, 149, 150, 152, and 154 that detects the fault determines (i.e., using processor 210) whether any power distribution networks downstream from that particular power distribution network also detected the fault. If one or more downstream power distribution networks also detected the fault, that particular power distribution network does not determine itself to be the fault location. If no downstream power distribution networks also detected the fault, that particular power distribution network identifies itself as the fault location.

For example, assume that power distribution network 148 detects the fault. If power distribution network 148 receives a fault detection message from power distribution network 149, power distribution network 148 does not determine itself to be the fault location. If, however, power distribution network 148 does not receive a fault detection message from power distribution network 149 (i.e., power distribution network 149 does not detect the fault), then power distribution network 148 determines itself to be the fault location. When a particular power distribution network determines itself to be the fault location, that power distribution network takes appropriate action to either isolate the fault (e.g., tripping an associated circuit breaker 156) or communicate the presence and location of the fault to a user for later isolation at a time of the user's choosing. Once the fault is isolated, personnel can proceed to safe, de-energized areas to identify and resolve the fault. In some embodiments, to facilitate ensuring that the fault is isolated, if no power distribution networks determine themselves to be the fault location after a predetermined time, circuit breakers 156 are tripped in all power distribution networks that detected the fault.

To facilitate determining the fault location, in the exemplary embodiment, a hierarchy of power distribution system 102 is stored in memory device 212 in each power distribution network 146, 148, 149, 150, 152, and 154. Specifically, the upstream and/or downstream relationships between power distribution networks 146, 148, 149, 150, 152, and 154 are stored in each memory device 212. Accordingly, for a given power distribution network, the associated processor 210 can determine whether that power distribution network is the fault location based on the one or more fault detection messages and the hierarchy stored in the associated memory device 212.

Accordingly, the distributed communications between power distribution network 146, 148, 149, 150, 152, and 154 enable identifying a fault location without utilizing a central controller. The distributed communications architecture also enables other functionality. For example, if the user chooses not to immediately isolate the fault, a risk exists that a second ground fault may occur. The second ground fault will appear as a phase to phase fault (unless it occurs on the same phase) and will not have the limiting of grounding resistor 142. In this situation, circuit breakers 156 detecting the fault may trip. By determining the fault location of the first ground fault, circuit breakers 156 in upstream power distribution networks may be restrained from tripping before the second ground fault occurs.

As compared to at least some known power distribution systems, the systems and methods described herein facilitate identifying a fault location without the use of portable measurement equipment. Further, the fault location systems described herein do not require a central control module to determine a fault location. Rather, the embodiments described herein utilize a distributed communication scheme to identify the location of a fault.

At least one technical effect of the systems and methods described herein includes (a) transmitting a synchronization message from a first power distribution network to all other power distribution networks of a plurality of power distribution networks, wherein the synchronization message includes a timing for the on periods and the off periods; (b) measuring, at each power distribution network, based on the synchronization message, a current to attempt to detect the fault; (c) broadcasting, from each power distribution network that detects the fault, a fault detection message; and (d)

determining, for each power distribution network that detects the fault, whether that power distribution network is the location of the fault.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A fault location system for locating a fault in a power distribution system, said fault location system comprising:
    a grounding resistor assembly configured to generate, in response to detection of the fault, a tracing signal that alternates between on periods and off periods; and
    a plurality of power distribution networks, wherein a first power distribution network of said plurality of power distribution networks is configured to:
        receive a synchronizing message that includes a timing for the on periods and the off periods;
        measure, based on the synchronization message, a current through said first power distribution network to attempt to detect the fault;
        broadcast a fault detection message to all other power distribution networks of said plurality of power distribution networks when the fault is detected at said first power distribution network; and
        determine whether said first power distribution network is the location of the fault.

2. A fault location system in accordance with claim 1, wherein a second power distribution network of said plurality of power distribution networks is configured to transmit the synchronization message to all other power distribution networks of said plurality of power distribution networks.

3. A fault location system in accordance with claim 2, wherein said second power distribution network of said plurality of power distribution networks is further configured to:
    calculate a compensation phasor; and
    include the calculated compensation phasor in the synchronization message.

4. A fault location system in accordance with claim 1, wherein each power distribution network of said plurality of power distribution networks comprises:
    a current sensor;
    a circuit breaker;
    a processor;
    a memory device; and
    a communication module.

5. A fault location system in accordance with claim 1, wherein said grounding resistor assembly comprises:
    a grounding resistor;
    a test signal generating device configured to partially short said grounding resistor to generate the tracing signal; and
    a control module configured to control operation of said test signal generating device.

6. A fault location system in accordance with claim 1, wherein to determine whether said first power distribution network is the location of the fault, said first power distribution network is configured to determine itself as the location of the fault when said first power distribution network broadcasts the fault detection message and no power distribution networks downstream from said first power distribution network broadcast fault detection messages.

7. A fault location system in accordance with claim 1, wherein said first power distribution network comprises a memory device, and wherein said first power distribution network is configured to determine whether said first power distribution network is the location of the fault based at least in part on a hierarchy stored on said memory device.

8. A power distribution network for locating a fault in a power distribution system, said power distribution network comprising:
    a communication module configured to receive a synchronization message that includes a timing for on periods and off periods of a tracing signal;
    a current sensor configured to measure a current through said power distribution network; and
    a processor communicatively coupled to said current sensor and configured to detect a fault based on the measured current and the synchronization message, wherein said communication module communicatively is configured to broadcast a fault detection message when the fault is detected, and wherein said processor is further configured to determine whether said power distribution network is the location of the fault.

9. A power distribution network in accordance with claim 8, wherein the synchronization message is received from at least one additional power distribution network.

10. A power distribution network in accordance with claim 9, wherein the synchronization message includes a compensation phasor calculated by the at least one additional power distribution network.

11. A power distribution network in accordance with claim 8, further comprising a circuit breaker, wherein said processor is configured to cause said circuit breaker to trip when said processor determines that said power distribution network is the location of the fault.

12. A power distribution network in accordance with claim 8, wherein said processor is configured to determine said power distribution network is the location of the fault when said communication module broadcasts the fault detection message and no additional power distribution networks downstream from said power distribution network broadcast fault detection messages.

13. A power distribution network in accordance with claim 8, wherein said processor is configured to detect a fault by averaging the measured current over a plurality of on periods and a plurality of off periods of the tracing signal.

14. A method for determining a location of a fault in a power distribution system, said method comprising:
   detecting the fault at a first power distribution network of a plurality of power distribution networks;
   generating a tracing signal using a grounding resistor assembly, wherein the tracing signal alternates between on periods and off periods;
   transmitting a synchronization message from the first power distribution network to all other power distribution networks of the plurality of power distribution networks, wherein the synchronization message includes a timing for the on periods and the off periods;
   measuring, at each power distribution network, based on the synchronization message, a current to attempt to detect the fault;
   broadcasting, from at least one power distribution network that detects the fault, a fault detection message; and
   determining whether the at least one power distribution network is the location of the fault.

15. A method in accordance with claim 14, wherein transmitting a synchronization message from the first power distribution network comprises transmitting a synchronization message that includes a compensation phasor calculated by the first power distribution network.

16. A method in accordance with claim 14, wherein generating a tracing signal comprises partially shorting a grounding resistor.

17. A method in accordance with claim 14, wherein determining whether the at least one power distribution network is the location of the fault comprises determining that the at least one power distribution network is the location of the fault when the at least one power distribution network broadcasts the fault detection message and no power distribution networks downstream from the at least one power distribution network broadcast fault detection messages.

18. A method in accordance with claim 14, wherein determining whether the at least one power distribution network is the location of the fault comprises determining whether the at least one power distribution network is the location of the fault based at least in part on a hierarchy stored on a memory device in the at least one power distribution network.

19. A method in accordance with claim 14, wherein generating a tracing signal comprises generating a tracing signal that has one second on periods and nine second off periods.

20. A method in accordance with claim 14, further comprising attempting to detect the fault by averaging the measured current over a plurality of the on periods and a plurality of the off periods.

* * * * *